(12) United States Patent
Montiel

(10) Patent No.: US 6,838,758 B1
(45) Date of Patent: Jan. 4, 2005

(54) PACKAGE AND METHOD FOR MAKING AN UNDERFILLED INTEGRATED CIRCUIT

(75) Inventor: Frank Montiel, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/567,533

(22) Filed: May 10, 2000

(51) Int. Cl.$^7$ .............................................. H01L 23/02
(52) U.S. Cl. ....................... 257/678; 257/737; 257/778; 257/738; 257/701
(58) Field of Search ................................ 257/737, 678, 257/778, 787, 738, 701

(56) References Cited

U.S. PATENT DOCUMENTS

| | | | |
|---|---|---|---|
| 4,654,502 A | | 3/1987 | Furtek ........................... 219/85 |
| 4,682,270 A | * | 7/1987 | Whitehead et al. ........... 361/764 |
| 5,208,450 A | * | 5/1993 | Uenishi et al. ............... 235/492 |
| 5,258,648 A | | 11/1993 | Lin ............................... 257/778 |
| 5,373,721 A | * | 12/1994 | Welsh et al. ..................... 72/377 |
| 5,634,267 A | * | 6/1997 | Farnworth et al. ............. 29/840 |
| 5,647,123 A | | 7/1997 | Greenwood et al. ........... 29/840 |
| 5,686,698 A | * | 11/1997 | Mahadevan et al. ........ 174/52.4 |
| 5,697,148 A | | 12/1997 | Lance, Jr. et al. ............. 29/840 |
| 5,710,071 A | | 1/1998 | Beddingfield et al. ........ 438/108 |
| 5,724,232 A | * | 3/1998 | Bhatt et al. .................. 361/762 |
| 5,798,014 A | * | 8/1998 | Weber .......................... 156/263 |
| 5,798,566 A | * | 8/1998 | Sato et al. .................... 257/712 |
| 5,889,912 A | * | 3/1999 | Otani et al. .................. 385/129 |
| 5,898,218 A | * | 4/1999 | Hirose et al. ................ 257/710 |
| 5,942,798 A | | 8/1999 | Chiu ............................ 257/737 |
| 6,031,284 A | * | 2/2000 | Song ........................... 257/701 |
| 6,057,513 A | * | 5/2000 | Ushikoshi et al. ........... 174/260 |
| 6,172,423 B1 | * | 1/2001 | Lee .............................. 257/780 |
| 6,228,682 B1 | * | 5/2001 | Farooq et al. ............... 438/110 |
| 6,492,717 B1 | * | 12/2002 | Gore et al. ................... 257/679 |

FOREIGN PATENT DOCUMENTS

JP          63173348 A   *  7/1988

* cited by examiner

Primary Examiner—Tom Thomas
Assistant Examiner—Chris C. Chu

(57) ABSTRACT

An integrated circuit package for use in flip-chip manufacturing has a surface having a depression for receiving a bumped die. The depression has disposed on its floor a plurality of cage pads. The depression has four walls, at least one of which is indented to form a step. In the flip-chip manufacturing process, a bumped die is positioned within the depression so that the solder bumps line up with the cage pads, and is precisely aligned and held in place by the depression. The die-package combination is then heated in a furnace to reflow the solder bumps, thus forming an integrated circuit. Using the indentation in the depression, underfill material is introduced into the depression. The underfill material flows into the depression and under the die, surrounding the reflowed solder bumps.

8 Claims, 4 Drawing Sheets

20

20

US 6,838,758 B1

PACKAGE AND METHOD FOR MAKING AN UNDERFILLED INTEGRATED CIRCUIT

BACKGROUND OF THE INVENTION

1. Field of the Invention

The present invention relates to the packaging of integrated circuits and electronic components, and more particularly, to an improved package for use in flip-chip manufacturing of an underfilled integrated circuit package.

2. Description of the Related Art

Interconnection and packaging related issues are among the main factors that determine not only the number of circuits that can be integrated on a chip, but also the performance of the chip. These issues have increased in importance as advances in chip design have led to reductions in the sizes of features on transistors and enlargements in chip dimensions. Industry has come to realize that merely having a fast chip will not result in a fast system; it must also be supported by equally fast and reliable packaging.

Essentially, packaging supplies the chip with signals and power, and performs other functions such as heat removal, physical support and protection from the environment. Another important function of the package is simply to redistribute the tightly packed I/Os off the chip to the I/Os of a printed wiring board.

An example of a package-chip system is the "flip-chip" integrated circuit mounted on an area array organic package. Flip-chip mounting entails placing solder bumps on a die or chip, flipping the chip over, aligning the chip with the contact pads on a package substrate, and reflowing the solder balls in a furnace to establish bonding between the chip and the substrate. This method is advantageous in certain applications because the contact pads are distributed over the entire chip surface rather than being confined to the periphery as in wire bonding and most tape-automated bonding (TAB) techniques. As a result, the maximum number of I/O and power/ground terminals available can be increased, and signal and power/ground interconnections can be more efficiently routed on the chips. With flip-chip packaging, proper alignment of the chip and the package is essential to ensure proper operation of the final assembly.

It is known in the art of integrated circuit packaging to use underfill material to add structural integrity to an integrated circuit manufactured by the above-described flip-chip technology. Referring to FIGS. 1A–1C, a prior art process provides a package board 12 having a package surface 102, which has disposed thereon a plurality of connect pads, or cage pads (not shown), which are to be connected to a chip or die 14. A chip 14 having a plurality of solder bumps 16 disposed thereon is provided and placed on top of the package surface 102 so that the solder bumps 16 lie on package pads (not shown). The package board 12 and die 14 form an integrated circuit package assembly 10, which is placed in an oven (not shown) where it is heated so that the solder balls 16 melt (reflow) to form solder connections 18. The integrated circuit package assembly 10 is then withdrawn from the oven (not shown) and allowed to cool. There remain air gaps 104 between the die 14, the package surface 102, and the solder connections 16. Underfill material 106 is dispensed onto the package surface 102, where it flows by capillary action under the die 14 and around the solder connectors 16. The underfill material 106 displaces air in the gaps 104, 106 surrounds the solder connections 18, and forms an insulating structure around the solder connector as well as an adhesive bonding structure between the package board 12 and the die 14, as seen in FIG. 1C. The underfill 106 acts as an adhesive between die 14 and package board surface 102, and thus increases the structural integrity of the integrated circuit package assembly 10, while protecting the solder connections 16 from chemical and mechanical wear.

Prior art methods of manufacturing an underfilled integrated circuit package assembly have disadvantages, however. One disadvantage to prior art processes is that a flat package board permits the die to move around thereon. Thus the die will often move and become misaligned after the die is positioned on the package board, but prior to reflowing of the solder balls. This results in defective products, with concomitant economic loss. Another disadvantage of prior art methods of manufacturing an integrated circuit is that prior art methods require that underfill material be applied in multiple iterations of small increments. This leads to increased process time, which increases economic costs. Additionally, prior art processes apply underfill material in layers, which results in a weaker adhesive effect than would be obtainable using a single layer of underfill material, since multiple layers have a tendency to separate or delaminate along the interstices of the layers. Also, prior art processes result in uneven application of underfill material, which often results in pockets of air remaining within the underfill material. These pockets of air can cause premature corrosion of solder connectors, uneven heat dissipation from the die, and other undesirable phenomena.

SUMMARY OF THE INVENTION

There is therefore a need in the art of flip-chip integrated circuit manufacturing for a package board that maintains the proper alignment of the die and the package board, after the die has been placed, and before reflowing has been completed. There is also a need in the art for a method of manufacturing integrated circuit package assemblies that makes use of a package board having the ability to maintain a die in proper alignment with the package board, after the die placement step, and before completion of the reflowing step. There is also a need in the art for a package board that permits more efficient application of underfill material to completely fill gaps between a die, a package board surface and solder connections. There is a need in the art for a method that provides for more efficient and complete application of underfill material to fill gaps in the integrated circuit package assembly. Finally, there is a need in the art for an underfilled integrated circuit package assembly wherein a die and a package are held together with greater adhesive strength than is possible with flat package boards available in the prior art.

The present invention provides a novel package board, for use in flip-chip integrated circuit manufacturing, that has a depression having package connector pads. An integrated circuit die, having solder bumps thereon, is positioned in the depression by a die placement tool. The walls of the depression align the die with the package connector pads and hold the die in place. The package and die, which together form an integrated circuit package assembly, are moved together from the die placement tool into a reflow furnace. The depression holds the die in place during the reflow step, thereby ensuring that the die will remain aligned with the connector pads on the package board surface. Thus, the present invention satisfies the need for a package board that aligns the die with the package connector pads while holding the die in place before and during the reflowing step.

The present invention also provides for a package board having a depression, wherein at least one of the walls of the depression has an indentation. The indentation is adapted to receive underfill material. The indentation may extend from one wall to another, or it may extend across only a portion of a wall. The indentation permits underfill material, such as a polymerizable material, to be introduced to the underside of the die after the reflow step has been completed. The indentation in the depression allows for application of the underfill material in fewer steps (as few as a single step) than is possible with prior art package boards having no depression. The depression acts as a reservoir for the underfill material, allowing the underfill material to completely and evenly fill the gaps between the die, package board and solder connections. Thus, the package board of the present invention also satisfies the need in the art for a package board that permits more efficient and complete application of underfill material.

The present invention also provides for a method of underfilling an integrated circuit package board according to the present invention. Thus, the present invention satisfies the need in the art for a method of manufacturing an integrated circuit package board assembly, which process is more efficient than prior art methods employing a flat package board.

The unique package board according to the present invention, when combined with a die, forms an integrated circuit package assembly wherein the die is held in place by the depression as it passes from a die placement tool to a reflowing oven. The reflowed integrated circuit package is then permitted to cool, after which underfill material is dispensed into the indentation, whence it flows into the depression, completely filling the gaps beneath the underside of the die. The underfill material may be applied in a single step, resulting in a single, cohesive layer of adhesive, which joins the die to the package surface. Because the underfill need not be layered, as is required in prior art processes, when the underfill material hardens, it holds the die in place with greater adhesive strength than would be possible using flat package boards according to prior art methods. Thus, the present invention also provides for an underfilled integrated circuit package that is superior in strength and durability when compared to prior art packages. Thus, the present invention satisfies the need in the art for an integrated circuit die and package assembly having superior strength and durability.

Additional advantages and novel features of the invention will be set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

DETAILED DESCRIPTION OF THE INVENTION

The present invention provides overcomes the deficiencies in the prior art by providing a unique package board having a depression that receives and holds in place an integrated circuit die, wherein at least one wall of the depression has an for receiving underfill material.

Figure 1A:
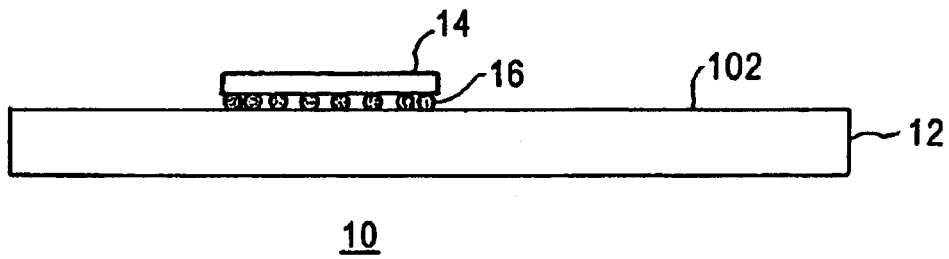
FIG. 1A is a side view of a prior art integrated circuit board having a bumped chip placed thereon, prior to reflowing.
Figure 1B:
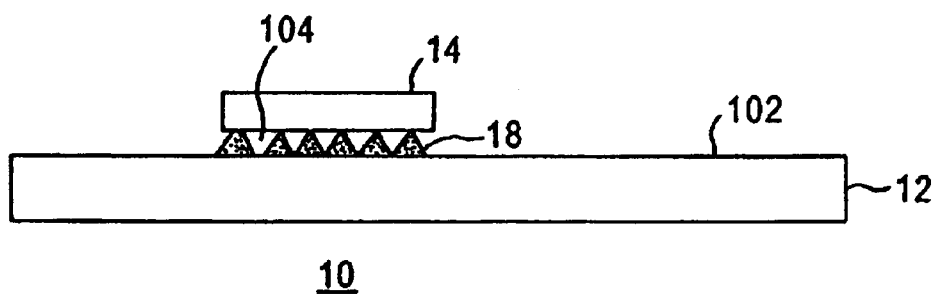
FIG. 1B is a side view of a prior art integrated circuit board and die after reflowing.
Figure 1C:
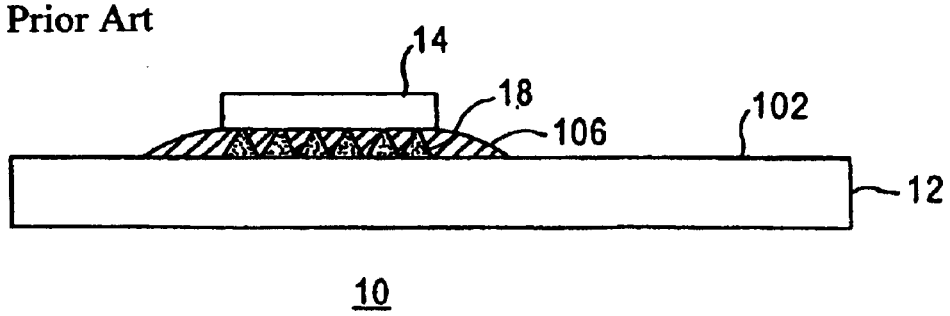
FIG. 1C is a side view of a prior art integrated circuit board and die after underfilling.
Figure 2A:
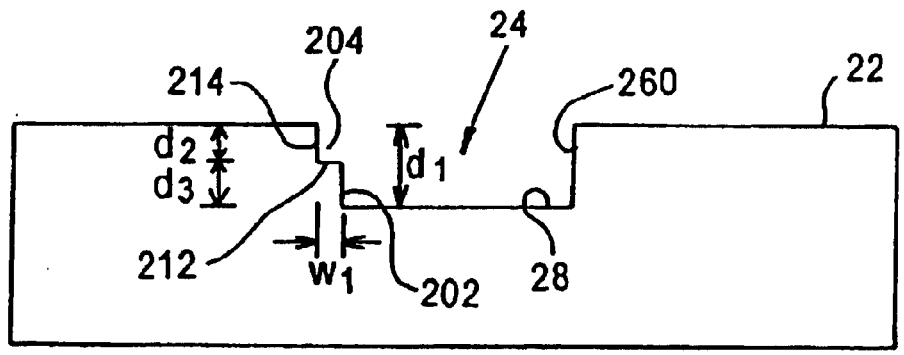
FIG. 2A is a cross-sectional side view of a package board according to the present invention.
Figure 2B:
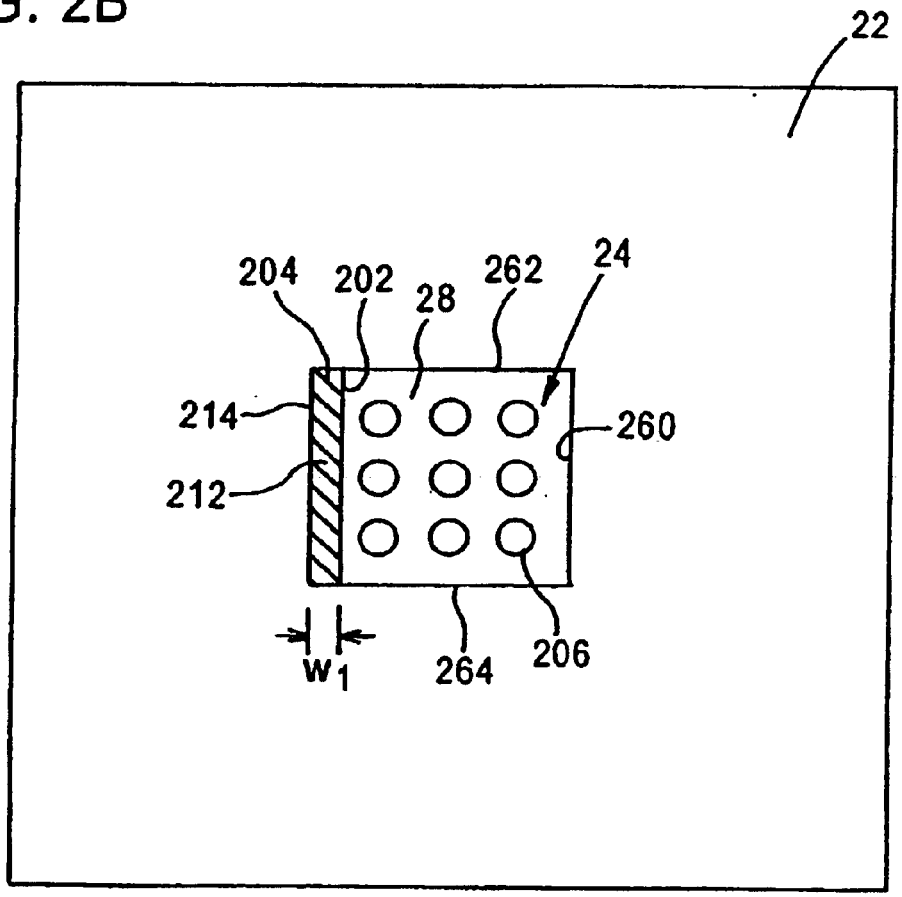
FIG. 2B is a top view of the package board of FIG. 2A.

FIGS. 2A and 2B depict a side cross-sectional view and a top view, respectively, of an exemplary package board 20 according to the present invention. The package board 20 has a top surface 22 and contains a depression 24. The depression 24 has a floor 28, three substantially vertical walls 260, 262, 264 and indented wall 202. Indented wall 202 contains indentation 204. The indentation 204 has a base 212 and a bulkhead 214. The base 212 of indentation 204 lies at an indentation base height d3 above the floor 28 of the depression 24. The base 212 of indentation 204 lies at an indentation base depth d2 lower than the top surface 22. The floor 28 lies at a depression floor depth d1 lower than the top surface 22. Thus, vertical walls 260, 262, 264 all have a height of d1, which is the sum of the indentation base height d3 and the indentation base depth d2. The horizontal distance along indentation base 212, from indentation bulkhead 214 to indentation wall 202 is an indentation width w1. Floor 28 has disposed within it package connectors 206.

In certain embodiments of the invention, walls 260, 262, 264 are 4 mil high (i.e. the depression floor depth d1 is 4 mil) and the indentation 204 is 1 mil deep (i.e. the indentation base depth d2 is 1 mil.) In the illustrated exemplary embodiment of the invention, the indentation 204 extends from vertical wall 262 to vertical wall 264. However in other embodiments, the indentation 204 does not extend the fall way from one to another of vertical walls 260, 262, 264.

In the illustrated exemplary embodiment, there is only one indentation 204. However, in other embodiments, one or more of walls 260, 262, 264 also contain additional indentations similar to indentation 204. In such embodiments, the additional indentations are configured, for example, to permit efflux of air, or addition of catalysts or initiators for polymerizing the polymerizable underfill material. In other embodiments, the underfill material may comprise two components for making a block copolymer. In such embodiments, the two components may be added through separate indentations and allowed to mix in the depression.

Figure 3A:
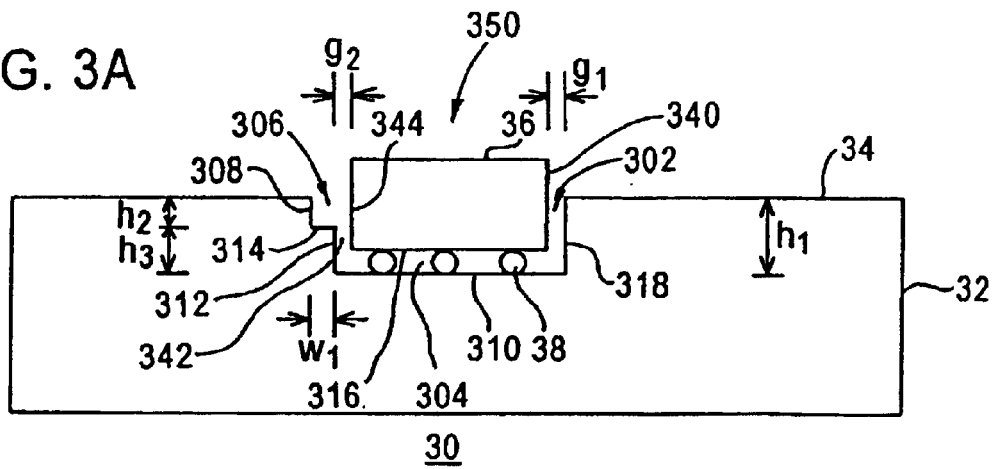
FIG. 3A is a cross-sectional side view of a package according to the present invention, having a bumped die placed thereon.
Figure 3B:
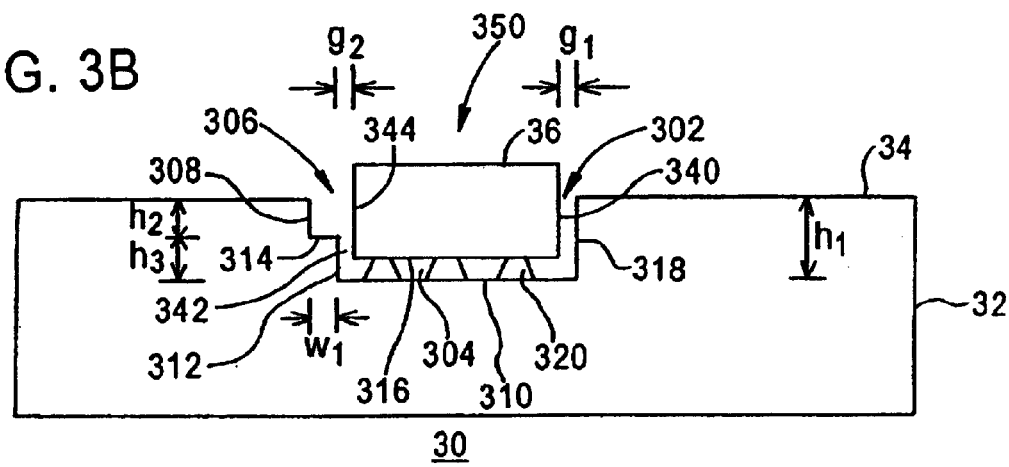
FIG. 3B is a cross-sectional side view of an integrated circuit package of FIG. 3A after reflowing.
Figure 3C:
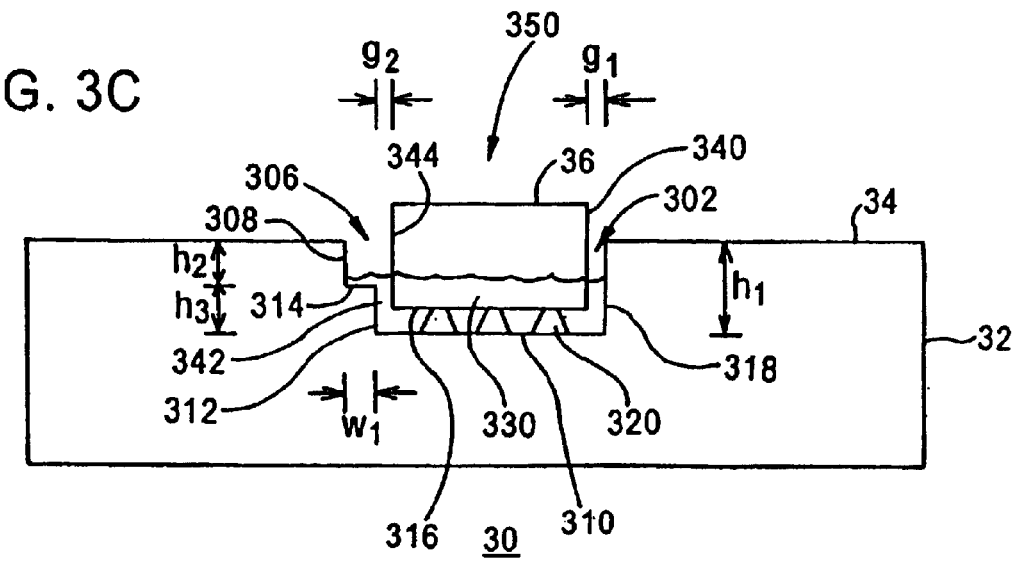
FIG. 3C is a cross sectional side view of an integrated circuit package of FIG. 3B after underfilling.

FIGS. 3A, 3B and 3C depict a cross-sectional view of an exemplary integrated circuit package assembly 30 according to the present invention. The integrated circuit package assembly 30 comprises a package board 32 according to the present invention, and an integrated circuit die 36. The package board 32 corresponds to the package board 20 of FIGS. 2A and 2B.

Figure 4:
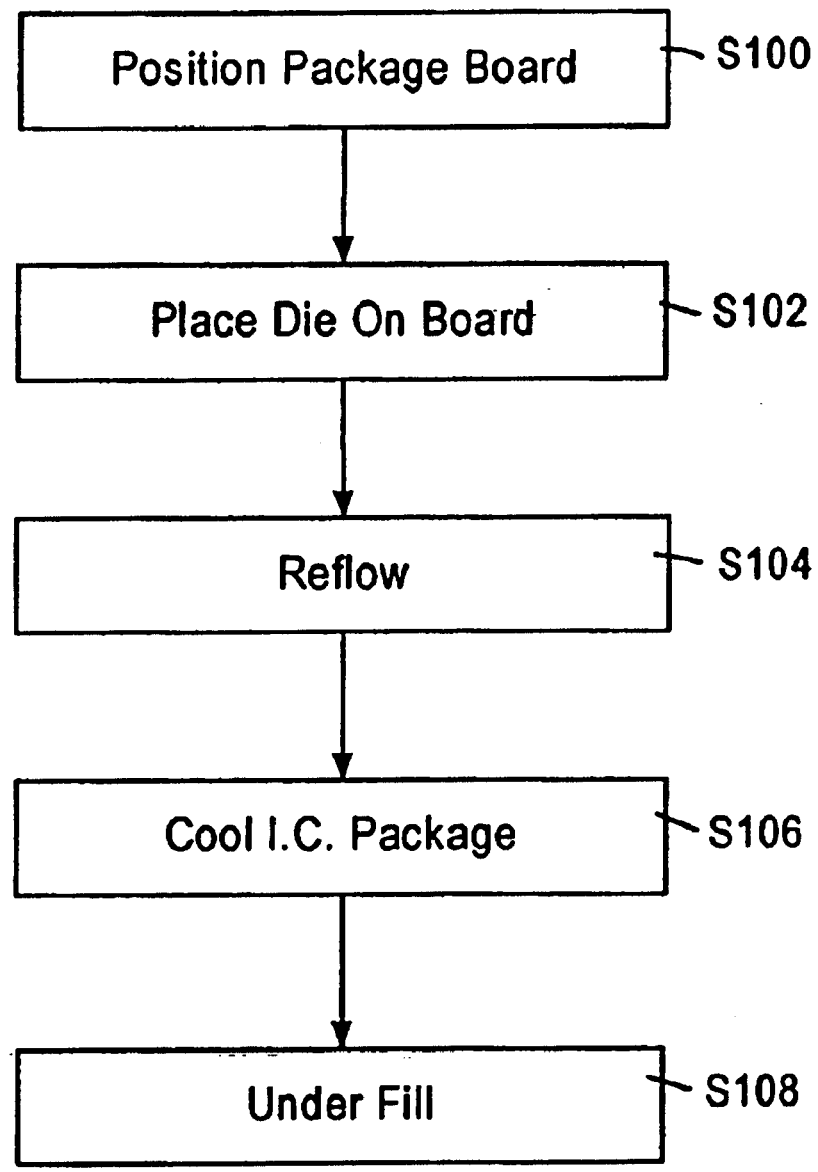
FIG. 4 is a block diagram depicting the process of manufacturing an integrated circuit package according to embodiments of the present invention.

FIG. 4 depicts, in block diagram form, an exemplary method of manufacturing underfilled integrated circuit packages according to the present invention.

In a package placement step S100 (FIG. 4) the package board 32 is placed on a die placement tool (not shown.) Following the package placement step S100 (FIG. 4) the die 36 is placed within the depression 350, in a die placement step S102 (FIG. 4), producing integrated circuit package assembly 30 (FIG. 3A).

In FIG. 3A, the integrated circuit package assembly 30 is depicted as it appears prior to a reflowing step S104 (FIG. 4). A package board 32, similar to package board 20 in FIG. 2, has a top surface 34, which contains a depression 350. The depression 350 has a floor 310, three vertical walls 318 (two walls not shown) and an indented wall 312, containing an indentation 306. The indentation 306 itself comprises an indentation base 314 and an indentation bulkhead 308.

The die 36 comprises an underside 316, front die wall 344 and side and back die walls 340 (side walls not shown). Solder balls 38 are disposed on the die underside 316. The solder balls 38 are disposed in such a way that they line up with connector pads (not shown) on depression floor 310.

The indentation 306 is adapted to receive underfill material 330 during an underfill step S108 (FIG. 4.) The indentation base 314 lies at base height h3 above depression floor 310, and at a base depth h2 below the package top surface 34. The sum of base depth h2 and base height h3 equals depression floor depth h1. The depression floor depth h1 is the distance between the package top surface 34 and depression floor 301. The distance between indented wall 312 and indentation bulkhead 308 is indentation width w1.

The base depth h2 and the base width w1 are chosen so that the indentation 306 is has sufficient volume to be suitably adapted for receiving underfill material 330, such as a polymerizable material. The proportions of h2 and w1 are determined based on the properties of the underfill material 330, such as its viscosity and surface wettability. In certain embodiments of the invention, either base depth h2 or base width w1 is approximately 1 mil. In other embodiments, both base depth h2 and base width w1 are approximately 1 mil. However, these values may be varied, depending on the properties of the underfill material, without affecting the essential operation of the invention.

The integrated circuit die 36, sits within the depression 350. Between the die walls 340 and the depression walls 318 there are die gaps 302. The distance between side and back die walls 340 and depression walls 318 is die gap distance g1. Between the die wall 344 and indented wall 312 there is an indentation gap 342. The distance between front die wall 344 and indented wall 312 is indentation gap distance g2.

The die gap distance g1 is selected such that it is small enough that die 36 is constrained within depression 350, and solder balls 38 remain aligned, within acceptable tolerances, with package connector pads (not shown) within the depression floor 310.

As shown in FIG. 3A, between die underside 316, depression floor 310 and solder balls 38, there are air spaces 304. During the reflowing step S104 (FIG. 4) the solder balls 38 melt. During the cooling step S106 (FIG. 4) the melted solder solidifies, forming solder connectors 320. The air spaces 304 remain, although their geometry is somewhat altered.

In the underfilling step S108 (FIG. 4), underfill material 330 is received by indentation 306. The indentation gap distance g2 is large enough to allow underfill material 330 to flow under the influence of gravity and/or capillary action from the indentation 306, through indentation gap 342, under die 36, and around solder connectors 320 to fill the air gaps 304. As the underfill material 330 flows from indentation 306, through indentation gap 342, it displaces air in the air gaps 304. The air escapes through die gaps 302 as it is forced out by the underfill material 330. As underfill material 330, for instance a polymerizable material, is generally more viscous than air, indentation gap distance g2 is generally greater than die gap distance g1, however in certain embodiments they may be approximately the same. For instance, where the polymerizable material is particularly non-viscous and particularly susceptible to the force of capillary action, a small value is chosen for indentation gap distance g2. Also, where the solder balls 38 are spaced far apart, that is where the tolerances are relatively relaxed, the die gap distance g1 is chosen to be concomitantly large.

In some embodiments of the invention, die gap distance g1 and indentation gap distance g2 are on the order of approximately 0.15 to approximately 15 mil. The indentation gap distance g2 is approximately the same size as, or greater than the die gap distance g1. In other embodiments, the indentation gap distance is approximately 2 to approximately 8 mil and the die gap distance is approximately 0.15 to approximately 2 mil. In an exemplary embodiment of the present invention, the die gap distance g1 is approximately 1 mil and the indentation gap g2 distance is approximately 4 mil.

An exemplary process of manufacturing an underfilled integrated circuit package according to the present invention is depicted in the block diagram of FIG. 4. In package board positioning step S100, a package board 32 (FIGS. 3A–3C) is placed on a chip placement tool (not shown). Then, in die placement step S102, a bumped chip 36 is placed within the depression 350 so that solder balls 38 match up with the package connector pads (not shown) on the depression floor 310. In reflowing step S104, the package and die combination 30 are passed into a reflowing oven (not shown) where the solder balls are 38 are brought to their reflow temperature, and melt to form solder connections 320 between the die 36 and the package connector pads (not shown). In cooling step S106 the package and die combination 30 is cooled so that the solder connections 320 become hard and form permanent, electrically conductive connections between the die 36 and the package 32. In underfilling step S106, underfill material 330 is dispensed into indentation 306. The underfill material 330 flows by gravity and/or capillary action to displace air in air gaps 304. Finally, the underfill material 330 polymerizes and hardens to completely encapsulate the solder connections 320 and fully contact the underside 316 of die 36. The result is an underfilled integrated circuit package 30 assembly according to the present invention.

In some embodiments of the present invention, sufficient underfill material 330 is dispensed into the indentation 306 that the underfill material 330 partially or fully extends up the side and back die walls 340 and the front die wall 344. In other embodiments, the underfill material 330 is dispensed in such amount that it rises only to the level where it fully contacts the die underside 316, but does not extend any higher. In other embodiments, underfill material 330 completely fills depression 350.

The underfill material 330 used in the present invention is any suitable polymer having suitable viscosity and wettability. It may comprise one or more polymerizable monomers, polyurethane prepolymers, constituents of block copolymers, constituents of radial copolymers, initiators, catalysts, crosslinking agents, stabilizers.

The present invention solves problems associated with prior art methods of manufacturing underfilled integrated circuit packages. The depression in the package board permits the die to fall into place, which permits the solder balls to precisely align with the package connector pads. The depression also keeps the die in place as it is moved from the die placement tool through the reflowing oven and on to the cooling stage. Thus, the present invention overcomes the problem of die slippage during transport of the die and package from a die placement tool to and through a reflowing oven.

Once the integrated circuit package assembly according to the present invention is cooled, the indentation permits dispensing of underfill material, in a single dispensing step, into the depression, which acts as a reservoir for the underfill material. This overcomes the prior art's inefficient process of iterative application of underfill material.

In the present invention, the underfill material fully contacts the underside of the die, thereby creating a strong, single layer of adhesive between the die and the package. The underfill may also surround the die, thereby adding increased adhesive strength to the integrated circuit package assembly. Thus, the present invention solves the problem of residual air gaps that often remain around solder connectors in prior art processes of manufacturing underfilled integrated circuit packages.

While this invention has been described in connection with what is presently considered to be the most practical and preferred embodiments, it is to be understood that the invention is not limited to the disclosed embodiments, but, on the contrary, is intended to cover various modifications and equivalent arrangements included within the scope of the appended claims.

What is claimed is:

1. An underfilled integrated circuit package comprising:
   a package board having a package top surface and a depression below the package top surface;
   an integrated circuit die seated within the depression in the package;
   the depression including;
   a floor and a first, second, third and fourth wall;
   the floor being substantially planar and comprising a plurality of package connector pads;
   the first wall having a first vertical section extending from the depression floor having an indentation therein, the second, third, and fourth walls being substantially vertical;
   reflowed solder connections connecting the die to the depression floor; and underfill material encapsulating the solder connections;
   wherein the indentation is configured to receive underfill material, and the first vertical section of the first wall, and the second, third and fourth walls, are configured to receive the integrated circuit die with narrow gaps between the walls and the integrated circuit.

2. An integrated circuit package of claim 1, wherein the indentation extends completely between two of the vertical walls.

3. An integrated circuit package of claim 1, wherein the depression is about 4 mil deep.

4. An integrated circuit package of claim 1, wherein the indentation is about 1 mil deep.

5. A method of manufacturing an underfilled integrated circuit package comprising:
   (a) providing an integrated circuit package board comprising:
   a surface having a depression therein, the depression comprising:
   a floor and a first wall, a second wall, a third wall and a fourth wall, the floor being substantially planar and having a plurality of package connector pads thereon;
   the first wall having an indentation therein, forming an underfill dispense side;
   the remaining walls being substantially vertical are planar from the floor to the top surface;
   (b) providing a die having a plurality of solder bumps corresponding to the package connector pads;
   (c) positioning the die within the depression so that the solder bumps lie on the package connector pads;
   (d) reflowing the solder bumps to form solder connections between the die and package, thereby forming an integrated circuit; and
   (e) dispensing underfill into the indentation to produce an underfilled integrated circuit package.

6. A method of claim 5, wherein the depression is about 4 mil deep.

7. A method of claim 6, wherein the indentation is about 1 mil deep and about 1 mil wide.

8. A method of claim 5, wherein the indentation is about 1 mil deep and approximately 1 wide.

* * * * *